(12) United States Patent
Kim et al.

(10) Patent No.: US 11,665,836 B2
(45) Date of Patent: May 30, 2023

(54) ELECTRONIC APPARATUS INCLUDING FLEXIBLE DISPLAY

(71) Applicant: LG ELECTRONICS INC., Seoul (KR)

(72) Inventors: Dongsung Kim, Seoul (KR); Wonseok Joo, Seoul (KR); Sangwook Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 68 days.

(21) Appl. No.: 17/473,885

(22) Filed: Sep. 13, 2021

(65) Prior Publication Data

US 2021/0410303 A1 Dec. 30, 2021

Related U.S. Application Data

(62) Division of application No. 16/857,048, filed on Apr. 23, 2020, now Pat. No. 11,147,171.

(30) Foreign Application Priority Data

Feb. 5, 2020 (WO) ................ PCT/KR2020/001669

(51) Int. Cl.
*H05K 5/00* (2006.01)
*H05K 5/02* (2006.01)
*G06F 1/16* (2006.01)
*H05K 5/03* (2006.01)

(52) U.S. Cl.
CPC ......... *H05K 5/0017* (2013.01); *H05K 5/0213* (2013.01); *H05K 5/0217* (2013.01); *H05K 5/03* (2013.01); *G06F 1/1652* (2013.01)

(58) Field of Classification Search
CPC .. G06F 1/1652; H05K 5/0017; H05K 5/0213; H05K 5/0217; H05K 5/03
See application file for complete search history.

(56) References Cited

U.S. PATENT DOCUMENTS

| | | | | |
|---|---|---|---|---|
| 10,008,135 B2* | 6/2018 | Lim | ...................... | G06F 1/1652 |
| 11,212,924 B2* | 12/2021 | Wang | ...................... | G02F 1/1333 |
| 2006/0152471 A1* | 7/2006 | Sugawara | ............. | G06F 1/1601 |
| | | | | 345/104 |
| 2015/0029229 A1* | 1/2015 | Voutsas | .................. | G06F 1/1647 |
| | | | | 345/1.3 |
| 2016/0202781 A1* | 7/2016 | Kim | ...................... | G06F 1/1643 |
| | | | | 345/173 |
| 2020/0022271 A1* | 1/2020 | Park | ...................... | H05K 5/0017 |
| 2021/0116975 A1* | 4/2021 | Moon | .................... | G06F 1/1652 |

* cited by examiner

*Primary Examiner* — Abhishek M Rathod
(74) *Attorney, Agent, or Firm* — Lee, Hong, Degerman, Kang & Waimey PC

(57) ABSTRACT

An electronic apparatus according to example embodiments may include a flexible display, a frame part configured to support the flexible display, and a rear cover attached to an outer surface of the frame part to cover at least a portion of the frame part, wherein the rear cover is disposed to be detachable from the frame part based on an electrical signal. Other various embodiments are also possible.

10 Claims, 19 Drawing Sheets

ELECTRONIC APPARATUS INCLUDING FLEXIBLE DISPLAY

CROSS-REFERENCE TO RELATED APPLICATIONS

This application is a divisional of U.S. patent application Ser. No. 16/857,048, filed on Apr. 23, 2020, which claims the benefit of earlier filing date and right of priority to International Application No. PCT/KR2020/001669, filed on Feb. 5, 2020, the contents of which are all hereby incorporated by reference herein in its entirety.

BACKGROUND

1. Field

This disclosure relates to an electronic apparatus including a flexible display.

2. Description of the Related Art

Recently, with developments of digital technologies, various types of electronic devices such as a mobile communication terminal, a smartphone, a tablet personal computer (PC), a notebook, a personal digital assistant (PDA), a wearable device, or a digital camera are widely used.

As performances of the electronic devices are improved, a desire for a large-area display that more efficiently provides various functions has increased. Meanwhile, the electronic device is required to be smaller and thinner to achieve increased portability, which conflicts with an electronic device having a large-area display.

Accordingly, research is conducted on an electronic device equipped with a flexible display (e.g., a foldable display, a rollable display, etc.) having a sufficient elasticity such that at least a portion of the display is folded or rolled when being carried and unfolded or spread to be used as necessary.

SUMMARY

In a case in which an electronic apparatus includes a flexible display, an external material may frequently flow into the electronic apparatus, for example, a space between the flexible display and a frame supporting the flexible display as an operation of changing a shape of the flexible display is repeated.

When the external material enters inside the electronic apparatus, the flexible display or a component of the electronic apparatus may be damaged due to the external material. Thus, there is a desire for a structure of the electronic apparatus that blocks an inflow of the external material or easily discharge the external material even if the external material enters the electronic apparatus.

According to an aspect, there is provided an electronic apparatus including a flexible display, a frame part configured to support the flexible display, and a rear cover attached to an outer surface of the frame part to cover at least a portion of the frame part, wherein the rear cover is disposed to be detachable from the frame part based on an electrical signal.

According to another aspect, there is also provided an electronic apparatus including a flexible display including a first area in which an image is displayed on a front surface of the electronic apparatus, a second area in which an image is displayed on a rear surface of the electronic apparatus, and a third area between the first area and the second area, wherein a position of the third area is changed, a frame part including a first frame that supports at least a portion of the first area and a second frame that supports the second area, and a rear cover attached to the second frame on the rear surface of the electronic apparatus, wherein the rear cover is detached from the second frame based on an electrical signal.

According to another aspect, there is also provided an electronic apparatus including a flexible display including a first area in which an image is displayed on a front surface of the electronic apparatus, a second area in which an image is displayed on a rear surface of the electronic apparatus, and a third area between the first area and the second area, a position of the third area being changed, a third frame configured to cover the third area of the flexible display, and at least one structure provided between the flexible display and the third frame to block an inflow of an external material.

BRIEF DESCRIPTION OF THE DRAWINGS

The above and other aspects, features, and advantages of certain embodiments will be more apparent from the following detailed description taken in conjunction with the accompanying drawings, in which.

DETAILED DESCRIPTION

Figure 1:
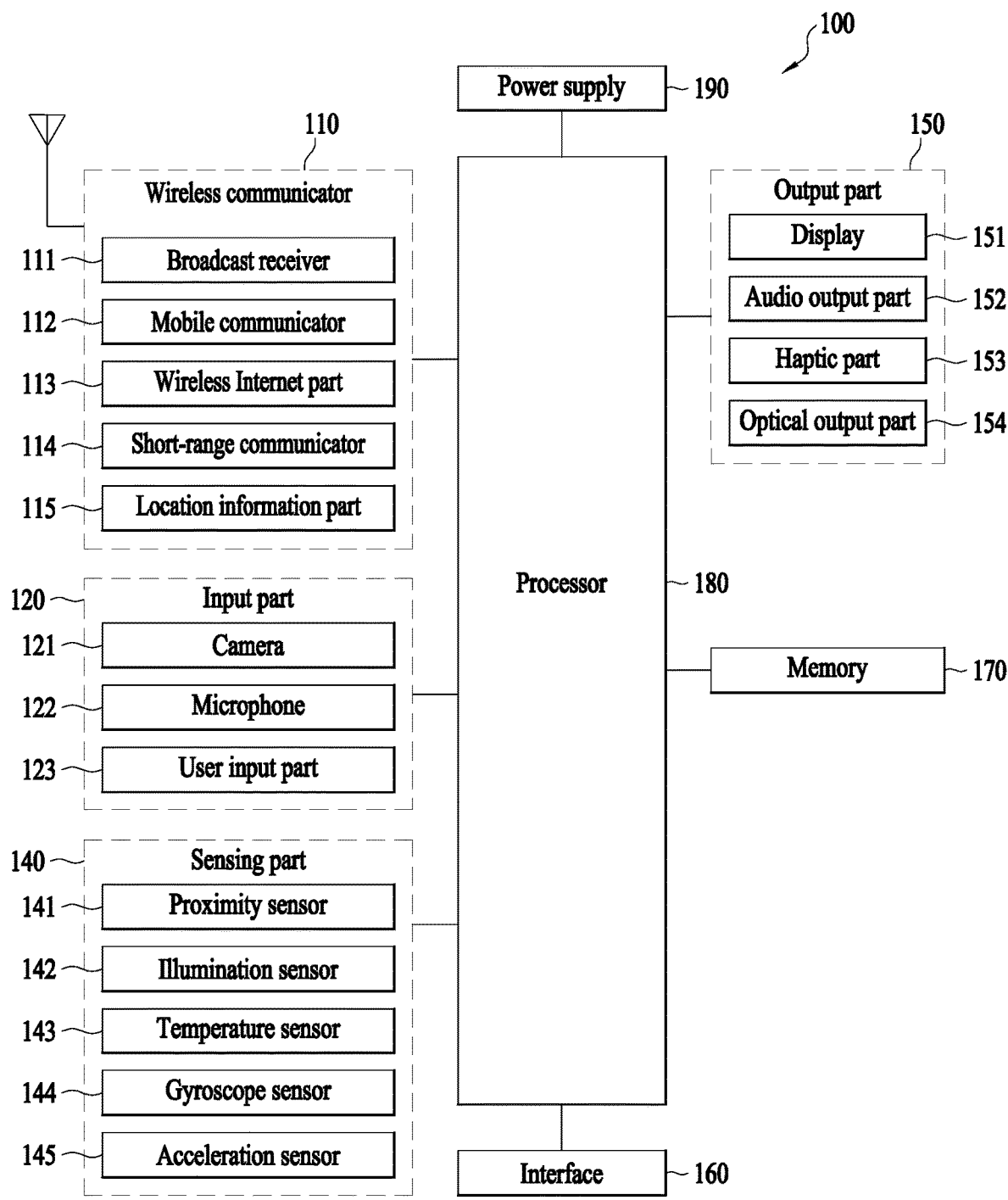
FIG. 1 is a block diagram illustrating an electronic apparatus according to example embodiments of the present disclosure.

Hereinafter, preferred embodiments of the present disclosure will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the present disclosure, moreover, the detailed description will be omitted when a specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

The terms 'first', 'second', etc. may be used to describe various components, but the components are not limited by such terms. The terms are used only for the purpose of distinguishing one component from other components.

When an arbitrary component is described as "being connected to" or "being linked to" another component, this should be understood to mean that still another component(s) may exist between them, although the arbitrary component may be directly connected to, or linked to, the corresponding other component. In contrast, when an arbitrary component is described as "being directly connected to" or "being directly linked to" another component, this should be understood to mean that no component exists between them.

A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

An electronic device according to various embodiments may include at least one of a mobile phone, a smartphone, a laptop computer, a digital broadcasting terminal, personal digital assistants (PDA), a portable multimedia player (PMP), a navigator, a slate PC, a tablet PC, an ultrabook, a wearable device (e.g., smartwatch), a smart glass, a head-mounted display (HMD), a digital TV, a desktop computer, or a digital signage.

FIG. 1 is a block diagram illustrating an electronic apparatus according to example embodiments of the present disclosure.

Referring to FIG. 1, an electronic apparatus 100 may include at least one of a wireless communicator 110, an input part 120, a sensing part 140, an output part 150, an interface 160, a memory 170, a controller 180, and a power supply 190.

The electronic apparatus 100 may include other components in addition to the components of FIG. 1 and may also include some of the components of FIG. 1.

The wireless communicator 110 may include at least one module that enables wireless communication to be performed between the electronic apparatus 100 and a wireless communication system, between the electronic apparatus 100 and another electronic apparatus (not shown) (e.g., the electronic apparatus 100), or between the electronic apparatus 100 and an external server. The wireless communicator 110 may include one or more modules that connect the electronic apparatus 100 to one or more networks. The wireless communicator 110 may include at least one of a broadcast receiving module 111, a mobile communication module 112, a wireless Internet module 113, a short-range communication (e.g., near-field communication (NFC)) module 114, and a position information module 115.

The input part 120 may include at least one of an image input part (for example, a camera 121) that receives an image signal input, an audio input part (for example, a microphone 122) that receives an audio signal input, or a user input part 123 that receives a user input. For example, the user input part 123 may receive a user touch input through a touch sensor (or touch panel) provided in a display 151 or receive a user input through a mechanical key. Information collected in the input part 120 (for example, voice data and image data) may be analyzed and processed as a control command of a user.

The sensing part 140 may include one or more sensors to sense at least one of information in the electronic apparatus 100, surrounding environment information of the electronic apparatus 100, or user information.

For example, the sensing part 140 may include at least one of a proximity sensor 141, an illumination sensor 142, a temperature sensor 143, a gyroscope sensor 144, and an acceleration sensor 145. In addition, the sensing part 140 may include a touch sensor, a finger scan sensor, a magnetic sensor, a gravity (G)-sensor, a motion sensor, an RGB sensor, an infrared (IR) sensor, an ultrasonic sensor, an optical sensor, a battery gauge, an environment sensor (for example, a barometer, a hygrometer, a thermometer, a radioactivity sensor, a heat sensor, and a gas detection sensor), or a chemical sensor (for example, an electronic nose, a healthcare sensor, and a biometric sensor).

In the present disclosure, the electronic apparatus 100 may use a combination of pieces of information sensed in at least two sensors among the aforementioned sensors.

The output part 150 may output information related to visual, auditory, or tactile. For example, the output part 150 may include at least one of the display 151, an acoustic output module 152, a haptic module 153, or an optical output part 154.

The display 151 may form a layer structure with a touch sensor or be integrally formed with the touch sensor, thereby implementing a touch screen that provides a touch input function and a screen display function simultaneously. For example, the touch screen may function not only as the user input part 123 that provides an input interface between the electronic apparatus 100 and a user but also as the output part 150 that provides an output interface between the electronic apparatus 100 and the user.

The electronic apparatus 100 may include the display 151 to display the image information. The display 151 may be a flexible type display to be rolled, bent, or folded. The flexible display may be manufactured on a thin and flexible substrate so as to be curved, bent, folded, twisted, or rolled like a paper while having a characteristic of a typical flat panel display.

The flexible display may implement a flexible touch screen in combination with a touch sensor. For example, the controller 180 may sense a touch input through the flexible touch screen of the flexible display and perform various functions corresponding to the touch input.

The electronic apparatus 100 may include a deformation detection means (not shown) that detects a change in shape of the flexible display. The electronic apparatus 100 may sense the change in shape of the flexible display using at least one component of the sensing part 140. For example, based on the change in shape of the flexible display sensed by at least one of the deformation detection means (not shown) or the sensing part 140, the controller 180 may change information displayed on the flexible display or generate a control signal.

The change in shape of the flexible display may include, for example, a change in size of a flexible display area viewable through the first surface (e.g., the front surface) of the electronic apparatus 100. For example, in response to a partial area of the flexible display being rolled, folded, or bent, a size of an image display area of the flexible display facing the first surface of the electronic apparatus 100 may be increased or reduced.

The change in shape of the flexible display may be caused based on an external force applied by a user but not limited thereto. The electronic apparatus 100 may automatically change the shape of the flexible display based on, for example, a predetermined application command or an input through the input part 120 or the sensing part 140. The electronic apparatus 100 may further include a driving part for changing the shape of the display. For example, the electronic apparatus 100 may change a position at which the flexible display is rolled or bent in response to the driving part being operated, thereby increasing or reducing the size of the flexible display viewable on the first surface. The driving part may be operated under a control of the controller 180.

The audio output module 152 may externally output audio data stored in the memory 170 or received from the wireless communicator 110 in a call signal reception, a call mode or a recording mode, a voice recognition mode, a broadcast reception mode, or the like. The audio output module 152 may output an acoustic signal associated with a function (for example, a call signal reception sound and a message reception sound) performed in the electronic apparatus 100. For example, the audio output module 152 may include at least one of a receiver, a speaker, or a buzzer.

The haptic part 153 may generate various tactile effects to be experienced by a user. A vibration may be a representative example of the tactile effects generated by the haptic part 153. An intensity and a pattern of the vibration generated by the haptic part 153 may be determined based on a selection of a user or setting of the controller 180. For example, the haptic part 153 may output a combination of different vibrations or output different vibrations in sequence.

The optical output part 154 may output a signal to announce an event occurrence using light of a light source of the electronic apparatus 100. For example, an event occurring in the electronic apparatus 100 may include at least one of message reception, call signal reception, missed call, alarm, schedule notification, e-mail reception, and application-based information reception.

The interface 160 may function as a passage to various types of external devices connected to the electronic apparatus 100. For example, the interface 160 may include at least one of a wired/wireless headset port, an external charger port, a wired/wireless data port, a memory card port, a port connecting a device equipped with an identification module, an audio input/output (I/O) port, a video I/O port, and an earphone port. In response to the interface 160 being connected to an external device, the electronic apparatus 100 may perform a control or a function associated with the connected external device.

The memory 170 may store data related to various functions of the electronic apparatus 100. For example, the memory 170 may store application programs (or applications) run in the electronic apparatus 100, data for operation of the electronic apparatus 100, and instructions. As an example, at least a portion of the application programs may be downloaded from an external server through wireless communication. As another example, at least a portion of the application programs may be previously stored in the memory 170 for a function (for example, call forwarding and outgoing function and message receiving and outgoing function) of the electronic apparatus 100. The application program stored in the memory 170 may be run to perform a predetermined operation (or function) of the electronic apparatus 100 based on the controller 180.

The controller 180 (e.g., processor) may control an overall operation of the electronic apparatus 100. For example, the controller 180 may process a signal, data, information, and the like input or output through components of the electronic apparatus 100 or run the application program stored in the memory 170, thereby providing information to a user or performing a predetermined function.

For example, to run the application program stored in the memory 170, the controller 180 may control at least a portion of the components of the electronic apparatus 100 of FIG. 1. To run the application program, the controller 180 may operate a combination of two or more components among the components included in the electronic apparatus 100.

The power supply 190 may supply power to each component included in the electronic apparatus 100 by receiving external or internal power based on a control of the controller 180. The power supply 190 may include a battery. The battery may include a built-in battery or a removable battery.

At least a portion of the aforementioned components of the electronic apparatus 100 may operate in cooperation with each other to implement an operation, a control, or a control method of the electronic apparatus 100 according to various embodiments as described below. Also, the operation, control, or control method of the electronic apparatus 100 may be embodied by running at least one application program stored in the memory 170.

The electronic apparatus 100 may be in a bar shape. However, embodiments are not limited thereto. The electronic apparatus 100 may have various shapes within the scope of not contradicting features of the present disclosure.

Figure 2A:
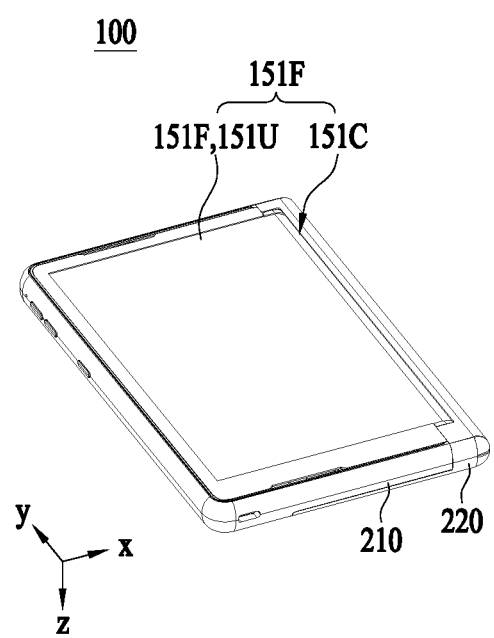
FIG. 2A is a front perspective view illustrating an electronic apparatus according to an example embodiment of the present disclosure.
Figure 2B:
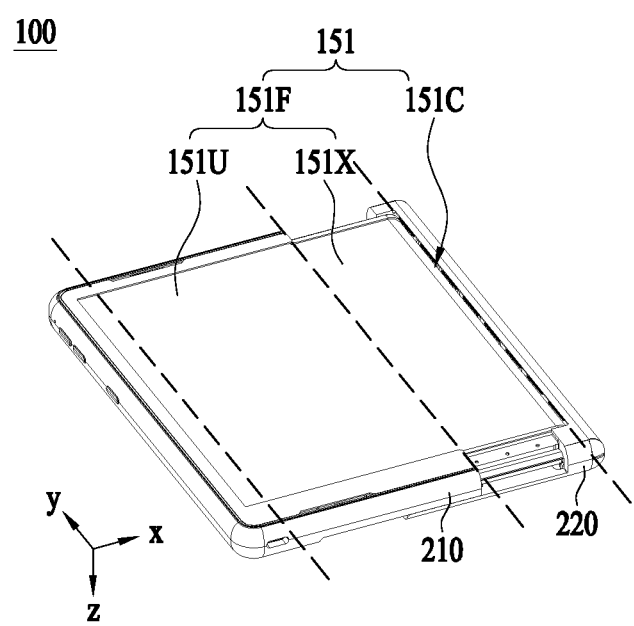
FIG. 2B is a front perspective view illustrating an electronic apparatus according to an example embodiment of the present disclosure.
Figure 3A:
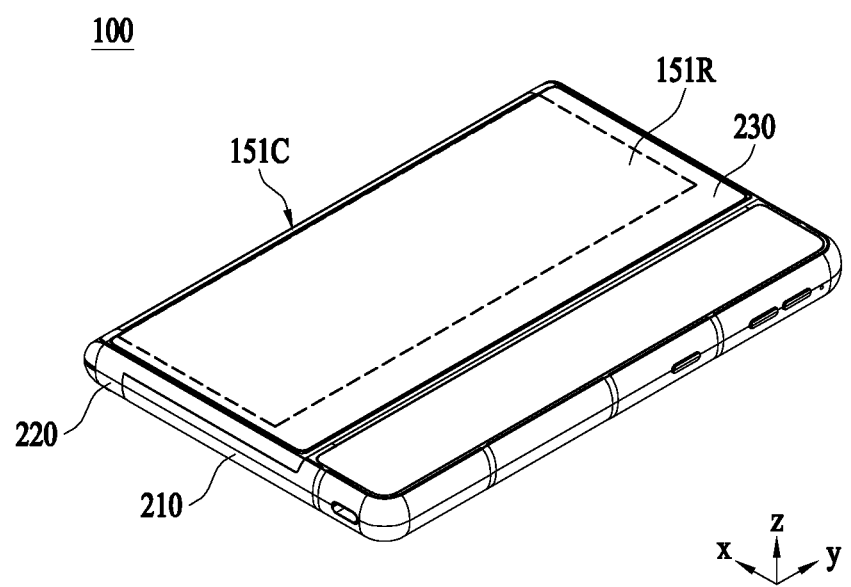
FIG. 3A is a rear perspective view illustrating an electronic apparatus according to an example embodiment of the present disclosure.
Figure 3B:
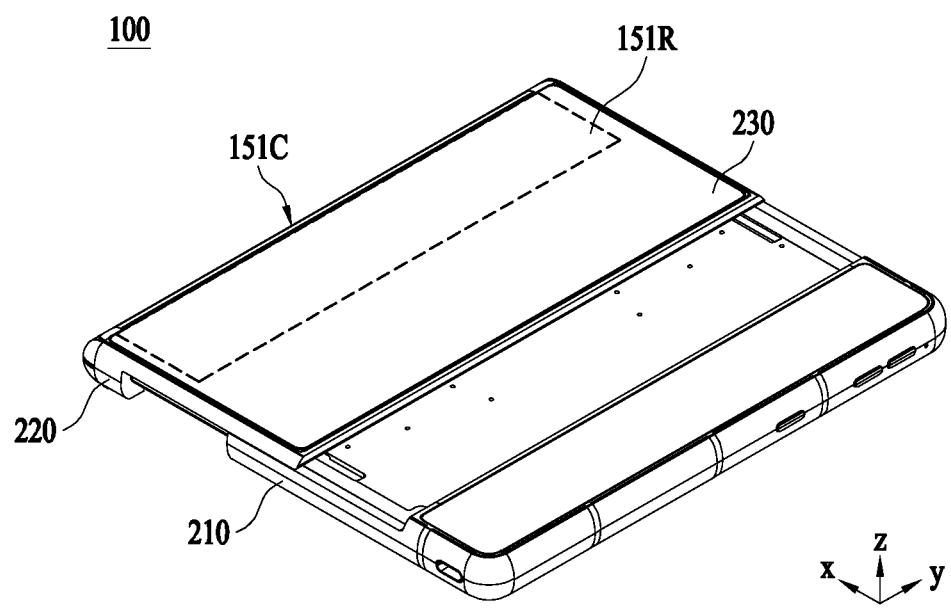
FIG. 3B is a rear perspective view illustrating an electronic apparatus according to an example embodiment of the present disclosure.

FIGS. 2A and 2B are front perspective views illustrating the electronic apparatus 100 according to an example embodiment of the present disclosure. FIGS. 3A and 3B are rear views illustrating the electronic apparatus 100 of FIGS. 2A and 2B.

Referring to FIGS. 2A through 3B, the electronic apparatus 100 may include the flexible display 151 that may increase or reduce an image output area viewable on a first surface (e.g., a front surface) of the electronic apparatus 100, that is, an area (e.g., a first area 151F) of the display 151 facing the first surface.

FIGS. 2A and 3A may correspond to a state in which the first area 151F is reduced in the electronic apparatus 100. Also, FIGS. 2B and 3B may correspond to a state in which the first area 151F is increased in the electronic apparatus 100.

According to example embodiments, the flexible display 151 may be rolled, folded, or bent at a partial area (e.g., a third area 151C). Also, in response to a change in position of the partial area, a size of the first area 151F of the display 151 facing the first surface of the electronic apparatus 100 may be increased or reduced.

For example, the flexible display 151 may include the first area 151F facing the first surface (e.g., the front surface) of the electronic apparatus 100, a second area 151R facing a second surface (e.g., a rear surface) of the electronic apparatus 100, and the third area 151C located between the first area 151F and the second area 151R.

The first area 151F may be, for example, an area in which an image is displayed on the first surface (e.g., the front surface) of the electronic apparatus 100 and may include a display area viewable from outside through the first surface. The second area 151R may be, for example, an area in which an image is displayed on the second surface (e.g., the rear surface) of the electronic apparatus 100 and may include a display area viewable from outside through the second surface.

The first area 151F may include a fixed area 151U and a variable area 151X. For example, even when the first area 151F is maximally reduced, the fixed area 151U may correspond to an area of the display 151 viewable on the first surface of the electronic apparatus 100. Also, the variable area 151X may correspond to an area of the display 151 additionally viewable on the first surface of the electronic apparatus 100 as the first area 151F increases. A size of the variable area 151X may vary based on a degree of moving a position at which the third area 151C is rolled, bent, and folded in the display 151. Meanwhile, the fixed area 151U may be maintained irrespective of a positional change of the third area 151C.

The electronic apparatus 100 may include components (e.g., a driving part and a frame part) for moving the rolled, bent, and folded area of the flexible display 151. For example, the electronic apparatus 100 may include a driving part (not shown) to move the position of the third area 151C at which the flexible display 151 is rolled, bent or folded.

The driving part may increase or reduce the size of the first area 151F of the flexible display 151 facing one surface (e.g., the first surface) of the electronic apparatus 100. For example, the driving part may withdraw a portion (e.g., the second area 151R) of the display 151 facing the second surface of the electronic apparatus 100 and position the portion to face the first surface. Also, the driving part may insert a portion (e.g., the first area 151F) of the display 151 facing the first surface and position the portion to face the second surface.

The driving part may be disposed adjacent to the third area 151C. For example, as illustrated in FIGS. 2A and 2B, the third area 151C may be disposed adjacent to a right side surface (e.g., a side surface portion of a second frame 220) based on the front surface of the electronic apparatus 100. Also, the driving part may be disposed on an inner side of the third area 151C to be adjacent to the third area 151C. In this case, as illustrated in FIGS. 2A and 2B, the variable area 151X may be located adjacent to the second frame 220 and the fixed area 151U may be located adjacent to a first frame 210.

Although not shown, in some cases, the third area 151C may be located adjacent to a left side surface (e.g., a side surface portion of the first frame 210) of the electronic apparatus 100 based on the front surface of the electronic apparatus 100 and the driving part may be disposed adjacent to the third area 151C. In such cases, unlike FIGS. 2A and 2B, the variable area 151X may be located adjacent to the first frame 210 and the fixed area 151U may be located adjacent to the second frame 220.

Meanwhile, the electronic apparatus 100 may include the first frame 210 and the second frame 220 as a frame part for supporting the flexible display 151 and other components in the electronic apparatus 100.

The first frame 210 and the second frame 220 may be disposed to slidably move in a direction in which a distance therebetween increases or decreases.

For example, the second frame 220 may move relative to the first frame 210 in response to a change in shape of the display 151. In response to the second frame 220 moving relative to the first frame 210, the size of the first area 151F or the second area 151R of the display 151 may be increased or reduced.

For example, the second frame 220 may slide relative to the first frame 210 in a direction in which a distance from the first frame 210 increases (e.g., +x direction), so that a display portion of the third area 151C or the second area 151R is withdrawn to the first surface (e.g., the front surface) as the variable area 151X of the first area 151F. In this example, the first area 151F may be increased and the second area 151R may be reduced.

Conversely, when the second frame 220 relatively moves in a direction in which the distance from the first frame 210 decreases (e.g., −x direction), at least a portion of the variable area 151X may be rolled into the second surface (e.g., the rear surface) of the electronic apparatus 100, so that the first area 151F is reduced and the second area 151R is increased.

The frame part may support the flexible display 151 based on the change in shape of the flexible display 151. As illustrated in FIGS. 2A through 3B, the first frame 210 may support at least a portion of the first area 151F and the second frame 220 may support the second area 151R. Also, in a state in the first area 151F is reduced, the first frame 210 and the second frame 220 may be located such that significant portions thereof overlap each other.

Meanwhile, a rear cover 230 may be attached to the second surface (e.g., the rear surface) of the electronic apparatus 100. The rear cover 230 may be provided on the second surface of the electronic apparatus 100 and function as a cover that shields inside components of the electronic apparatus 100 not to be exposed outside.

At least a portion of the rear cover 230 may include a substantially transparent material, so that an image displayed in the second area 151R is viewable from outside through the rear cover 230.

Figure 4:
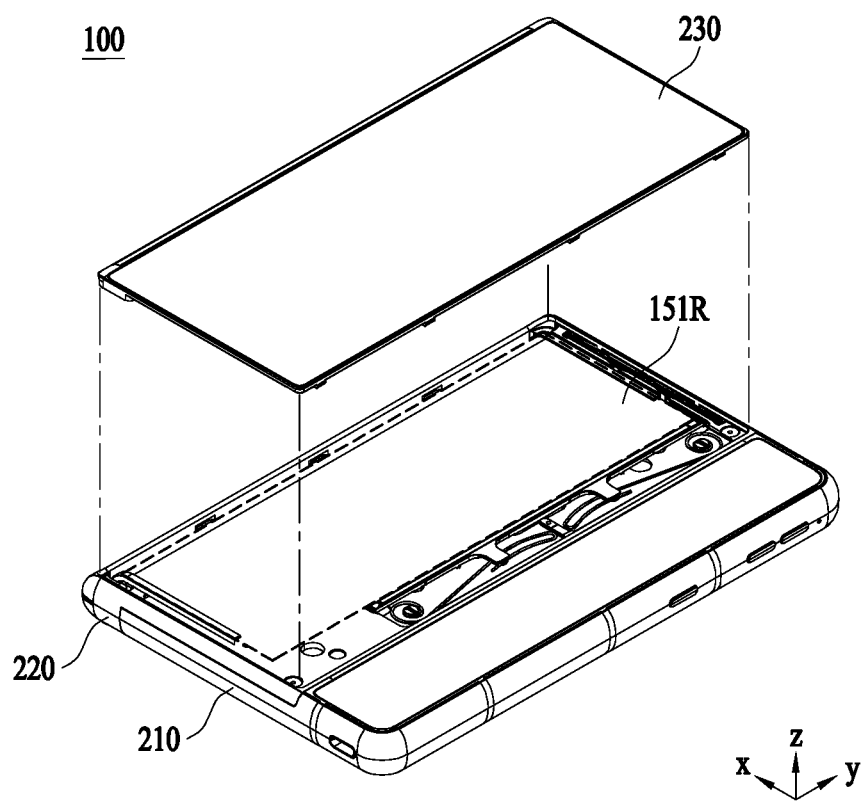
FIG. 4 is an exploded perspective view illustrating an electronic apparatus according to an example embodiment of the present disclosure.

FIG. 4 is an exploded perspective view illustrating an electronic apparatus according to an example embodiment of the present disclosure.

Referring to FIG. 4, the rear cover 230 may be attached to an outer surface of the frame part to cover at least a portion of the frame part (e.g., the first frame 210, the second frame 220).

The rear cover 230 may be provided in a structure that is detachably attached to the outer surface of the frame part.

The rear cover 230 may be attached to one surface of the frame part that covers the third area 151C of the flexible display 151. In one example, as illustrated in FIGS. 2A through 3B, when the third area 151C is disposed inside the side surface portion of the second frame 220, the rear cover 230 may be attached to one surface of the second frame 220 that forms the second surface of the electronic apparatus 100.

In another example, although not shown, the third area 151C may be disposed internal to the side surface portion of the first frame 210. In this example, the rear cover 230 may be attached to one surface of the first frame 210 that forms the second surface of the electronic apparatus 100.

The rear cover 230 may be coupled to an edge of the frame part adjacent to the third area 151C on the second surface of the electronic apparatus 100.

As illustrated in FIG. 4, at least a portion of the flexible display 151, for example, the second area 151R may be located between the rear cover 230 and the frame part to which the rear cover 230 is attached. The second area 151R located between the rear cover 230 and the frame part may be increased or reduced in response to a change in position of the third area 151C.

As described above, the change in shape (e.g., the increase or reduction of the first area 151F or the second area 151R) may repetitively occur in the flexible display 151. Due to this, an external material (e.g., a foreign substance) may enter between the flexible display 151 and the frame part.

When the external material enters between the flexible display 151 and the frame part, inside components of the electronic apparatus 100 may be damaged by the external material. Thus, a structure for blocking an entry of the external material or easily discharging the external material to outside may be required in the electronic apparatus 100.

The electronic apparatus 100 may use a structure in which the rear cover 230 is selectively detached from the frame part, to discharge the external material (e.g., the foreign substance) entering between the flexible display 151 and the frame part to outside. For example, based on an electrical signal, the electronic apparatus 100 may attach the rear cover 230 to the frame part or detach the rear cover 230 from the frame part. Hereinafter, an attachment and detachment method of the rear cover 230 will be described in detail.

Figure 5:
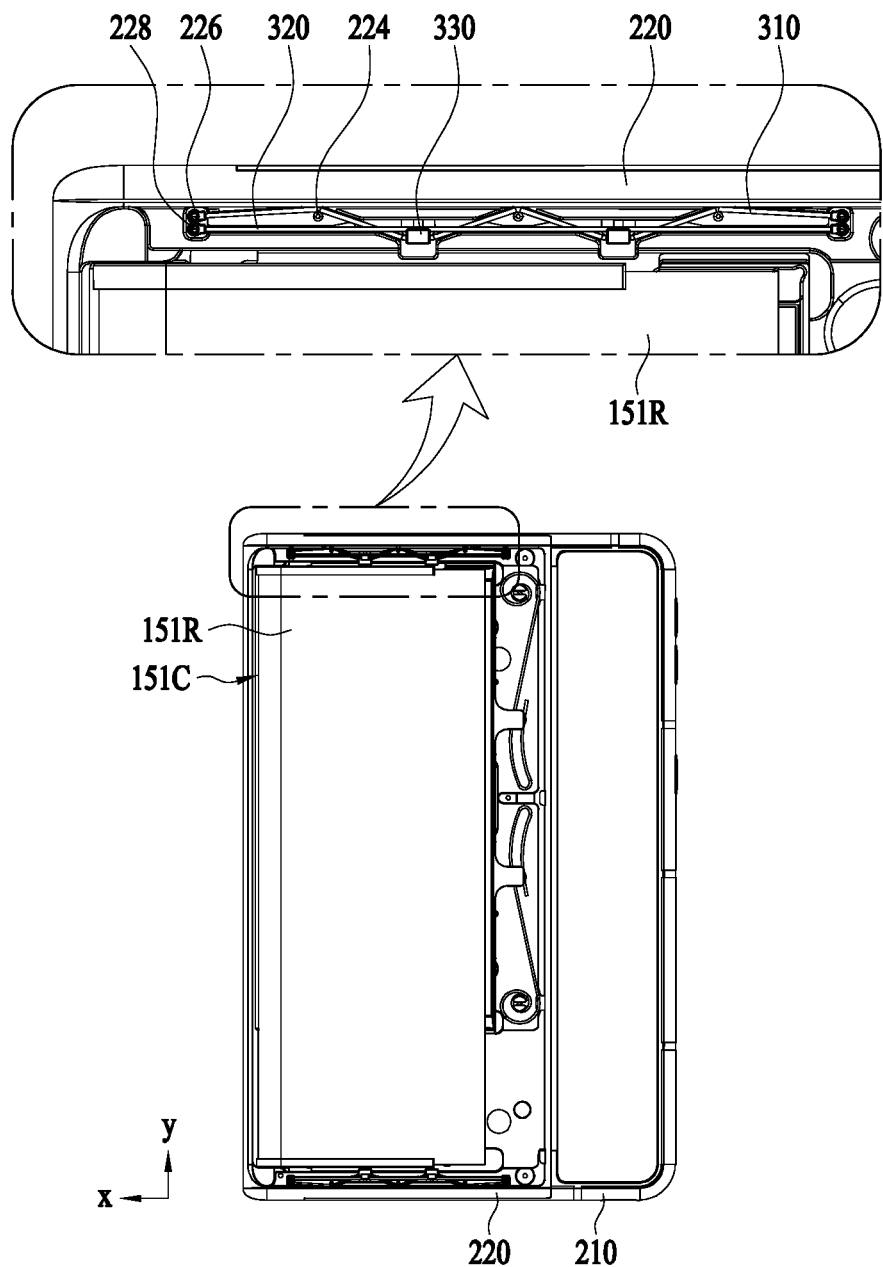
FIG. 5 is a cross-sectional view illustrating an internal structure of an electronic apparatus according to an example embodiment of the present disclosure.
Figure 6A:
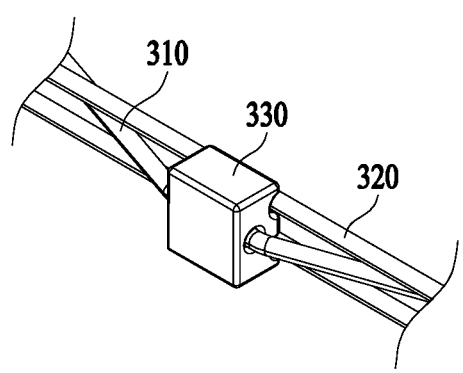
FIGS. 6A through 6C are views illustrating a configuration of a coupling member according to an example embodiment of the present disclosure.
Figure 6B:
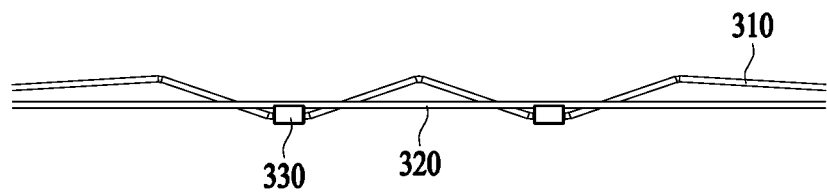
Figure 6C:
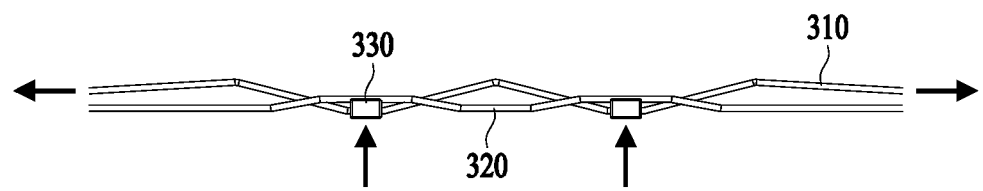

FIG. 5 is a cross-sectional view illustrating an internal structure of an electronic apparatus according to an example embodiment of the present disclosure. FIGS. 6A through 6C are views illustrating a configuration of a coupling member according to an example embodiment of the present disclosure.

For example, FIG. 5 illustrates the electronic apparatus 100 in which the rear cover 230 is detached or separated from the frame part (e.g., the second frame 220).

Referring to FIGS. 5 through 6C, the electronic apparatus 100 may include a coupling member to selectively attach or detach the rear cover 230 to or from the frame part.

For example, at least one coupling member (e.g., a first element 310, a second element 330, and a third element 320) may be arranged in a side portion of the frame part based on a position to which the rear cover 230 is attached.

The coupling member may be disposed for each edge or at least one edge of a surface to which the rear cover 230 is attached. For example, as illustrated in FIG. 5, the coupling member (e.g., the first element 310, the second element 330, and the third element 320) may be disposed at each of a top edge and a bottom edge based on the second surface (e.g., the rear surface) of the electronic apparatus 100.

The coupling member may couple the rear cover 230 to the frame part or decouple the rear cover 230 from the frame part based on an electrical signal.

The coupling member may include the first element 310, the second element 330, and the third element 320.

The first element 310 may be extended or contracted based on an electrical signal. The first element 310 may be formed using, for example, a shape memory alloy material.

For example, the first element 310 may have a shape of a wire. The first element 310 may contract in accordance with a temperature change (e.g., an increase of a temperature) occurring when an electrical signal is received. Also, the first element 310 may be extended when the receiving of the electrical signal is released. As such, a length of the wire may be changed.

Both end portions of the first element 310 may be fixed to the frame part. For example, both end portions of the first element 310 may be fixed to first protrusions 226 provided on one surface of the frame part. Also, the first element 310 may be supported by second protrusions 224 (refer to FIG. 5) provided on one surface of the frame part so as to be maintained in a constant shape.

The first element 310 may correspond to a component for controlling a position of the second element 330. For example, based on whether an electrical signal is received to the first element 310, the second element 330 may move in one direction in response to the first element 310 being contracted or extended, thereby changing in position. For this, the second element 330 may be connected with the first element 310 to be changed in position based on a length change due to the extension and contraction of the first element 310. As illustrated in FIG. 6A, the first element 310 may be disposed to penetrate a central hole 332 (refer to FIG. 7A) of the second element 330 to be connected to the second element 330.

Meanwhile, as illustrated in FIG. 5, at least two second elements 330 may be connected to the first element 310. The second element 330 may be a component directly coupled to or decoupled from the frame part. When the second element 330 is provided in plurality, the rear cover 230 may be more stably mounted on the frame part.

As described above, when an electrical signal is received, the first element 310 may longitudinally contract and a contractile force may be exerted on both end portions of the first element 310 in a direction in which a distance therebetween increases (refer to FIG. 6C).

Accordingly, the at least one second element 330 connected to a middle side of the first element 310 may receive a force in a direction in which the first element 310 is tightened, so as to move in a first direction (e.g., +y direction of FIG. 5).

The third element 320 may be in a form of a wire similar to the first element 310 and have both end portions fixed to the frame part. For example, the end portion of the third element 320 may be fixed to a third protrusion 228 (refer to FIG. 5) provided on the frame part.

The third element 320 may be connected to the second element 330.

For example, the third element 320 may partially restrict a movement of the second element 330 to prevent the second element 330 from excessively separating from a predetermined position in response to the first element 310 being contracted.

The third element 320 may be formed of a material having a relatively high elasticity.

For example, when the first element 310 contracts in response to the electrical signal being received and the second element 330 moves in the first direction (e.g., an upward direction of FIG. 6C), the third element 320 connected with the second element 330 may be pressurized in the first direction and generate an elastically restoring force in a second direction (e.g., a downward direction of FIG. 6C) opposite to the first direction.

Meanwhile, in response that the receiving of the electrical signal is released, the first element 310 may be extended so that a length is restored to a state before the contraction. In this case, the second element 330 may move in the second direction by the elastically restoring force generated by the third element 320, and return to a position before the contraction of the first element 310 (refer to FIG. 6B).

In other words, when the electrical signal is applied, the second element 330 may move in the first direction by a contractile force generated due to the contraction of the first element 310. Also, when the applying of the electrical signal is released, the second element 330 may move in the second direction by the extension of the first element 310 and the elastically restoring force of the third element 320.

As illustrated in FIG. 6A, the plurality of third elements 320 may be connected to the single second element 330. The third elements 320 may be coupled to a plurality of grooves 334 (refer to FIG. 7A) formed in the side portion of the second element 330. For example, the third elements 320 may be connected or coupled to the second element 330 on one surface of the second element 330 facing the first direction, so as to prevent the second element 330 from moving in the first direction when the first element 310 is contracted or to generate a compressive restoring force in the second direction in response to the second element 330 moving in the first direction.

Figure 7A:
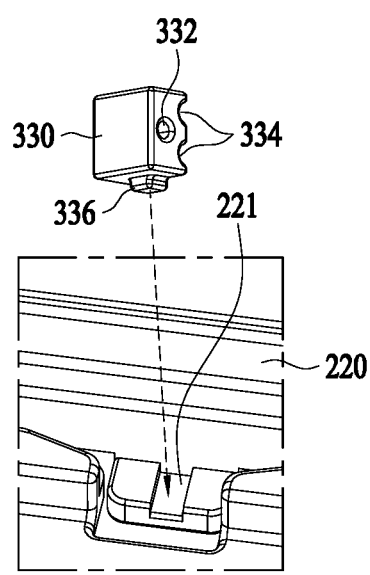
FIG. 7A is a view illustrating a position in which a second element is disposed according to an example embodiment of the present disclosure.

FIG. 7A is a view illustrating a position in which a second element is disposed according to an example embodiment of the present disclosure.

Referring to FIG. 7A, the frame part (e.g., the second frame 220) may further include a guide rail 221 on one surface of the frame part facing the rear cover 230 to correspond to a position of the second element 330.

When the second element 330 moves by a force applied in a first direction or a second direction, the guide rail 221 may prevent the second element 330 from being deviated in a direction other than the first and second directions.

The electronic apparatus 100 may couple or attach the rear cover 230 to the frame part or decouple the rear cover 230 from the frame part based on a position of the second element 330 moved along the guide rail 221 in the first direction or the second direction.

Figure 7B:
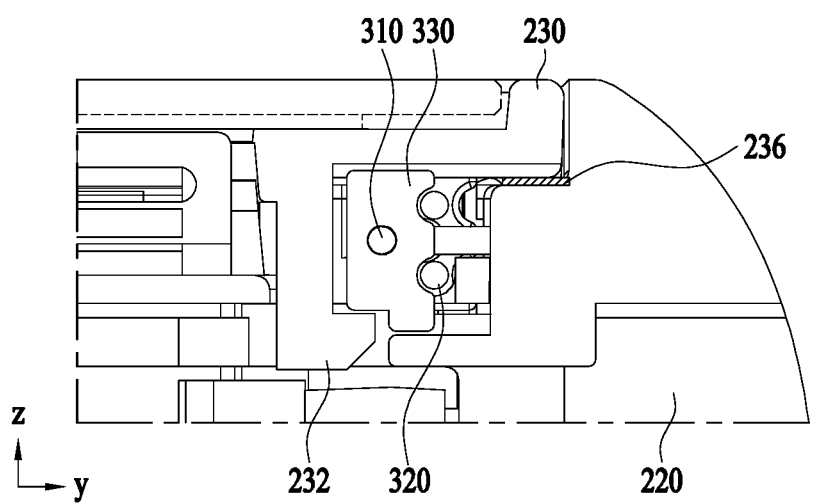
FIG. 7B is a side sectional view illustrating an electronic apparatus according to an example embodiment of the present disclosure.
Figure 7C:
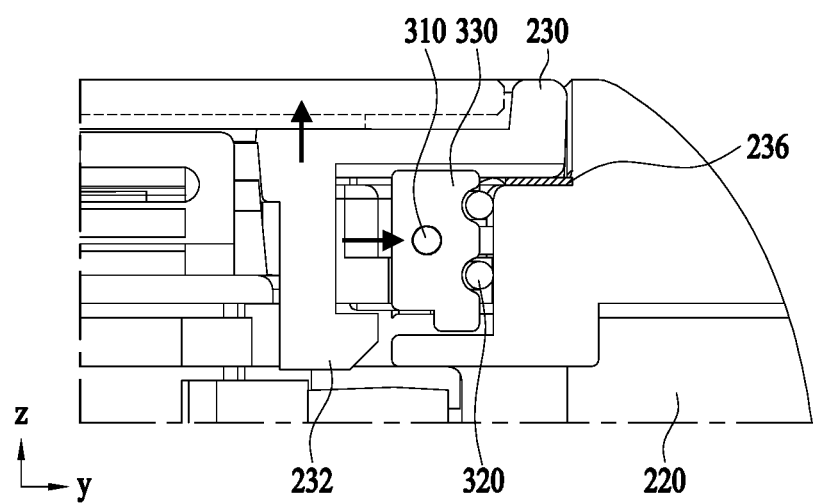
FIG. 7C is a side sectional view illustrating an electronic apparatus according to an example embodiment of the present disclosure.

FIG. 7B is a side sectional view illustrating an electronic apparatus in which the rear cover 230 is coupled with the frame part, and FIG. 7C is a side sectional view illustrating the electronic apparatus in which the rear cover 230 is decoupled from the frame part.

Referring to FIGS. 7B and 7C, when an electrical signal is received to the first element 310, the second element 330 may move in a first direction (e.g., +y direction) in response to the first element 310 being contracted. Also, when the receiving of the electrical signal is released, the second element 330 may move in a second direction (e.g., −y direction) in response to the first element 310 being extended and an elastically restoring force by the third element 320 being exerted.

Meanwhile, the rear cover 230 may include a hook 232 to be coupled with the second element 330, on one surface facing the frame part (e.g., the second frame 220).

In FIG. 7B, when the electrical signal is not received to the first element 310, the second element 330 may couple the rear cover 230 to the frame part (e.g., the second frame 220) as a state of being engaged with the hook 232 in a +z-axial direction.

In FIG. 7C, when the electrical signal is received to the first element 310, the second element 330 may move in a first direction (e.g., +y direction) and thus, disengaged from the hook 232 in the +z axis direction. Through this, the rear cover 230 may be decoupled from the frame part (e.g., the second frame 220) to be separated or deviated in the +z direction.

The electronic apparatus 100 may further include a pad 236 in an area in which the frame part contacts the rear cover 230 when the rear cover 230 is coupled to the frame part (e.g., the second frame 220). For example, the pad 236 may prevent the external material (e.g., the foreign substance) enters between the rear cover 230 and the frame part in a state in which the rear cover 230 is coupled with the frame part.

Figure 8A:
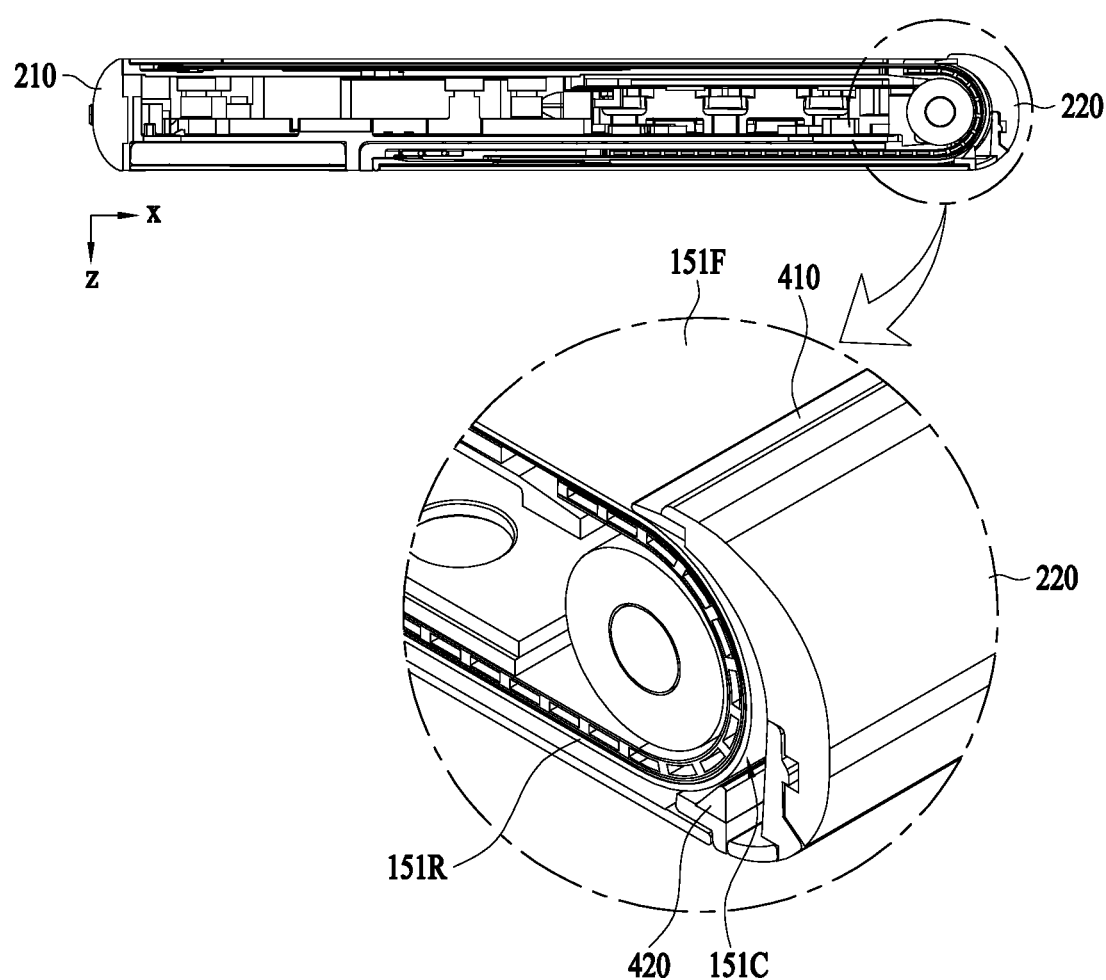
FIGS. 8A and 8B are views illustrating a structure of an electronic apparatus according to an example embodiment of the present disclosure.
Figure 8B:
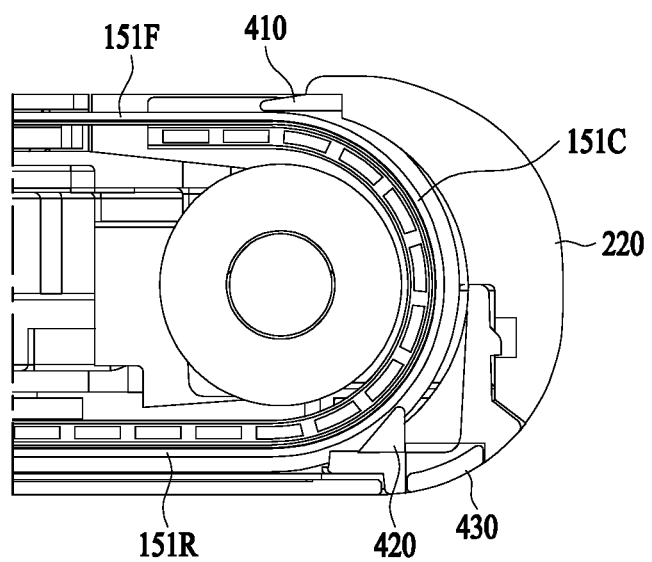

FIG. 8A illustrates a cross-sectional view of an electronic apparatus and an enlarged perspective view of a portion of the electronic apparatus according to an example embodiment. FIG. 8B is a cross-sectional view illustrating the portion of the electronic apparatus of FIG. 8A.

The electronic apparatus 100 may include the flexible display 151 including the first area 151F in which an image is displayed on the first surface (e.g., the front surface) of the electronic apparatus 100, the second area 151R in which an image is displayed on the second surface (e.g., the rear surface) of the electronic apparatus 100, and the third area 151C between the first area 151F and the second area 151R.

A position of the third area 151C may be changeable. Based on a change in the third area 151C, a size of the first area 151F or the second area 151R may be changed.

The electronic apparatus 100 may include a third frame that covers the third area 151C. The third frame that covers the third area 151C may be either the first frame 210 or the second frame 220. For example, when the third area 151C is disposed internal to the side surface portion of the second frame 220, the third frame may correspond to the second frame 220 as illustrated in FIG. 8A.

Referring to FIGS. 8A and 8B, the electronic apparatus 100 may include at least one structure (e.g., a first structure 410 and a second structure 420) between the flexible display 151 and the third frame (e.g., the second frame 220) to block an inflow of an external material (e.g., a foreign substance).

For example, to block an external material entering between the first area 151F and the third frame, the first structure 410 may have a pin shape in which one end is fixed to the third frame and the other end extends toward the first area 151F. The first structure 410 may shield a space between the first area 151F and the third frame.

Figure 9A:
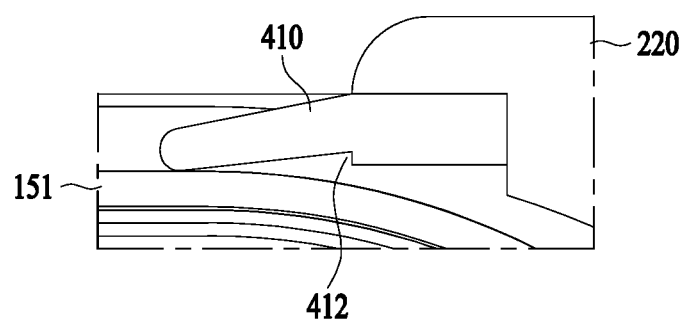
FIGS. 9A and 9B are views illustrating a first structure according to example embodiments of the present disclosure.
Figure 9B:
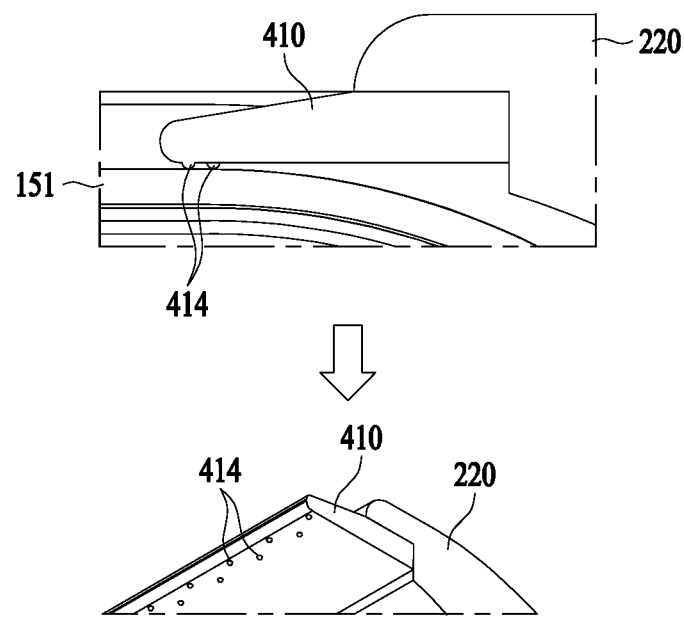

FIGS. 9A and 9B are views illustrating a first structure according to example embodiments of the present disclosure.

Referring to FIG. 9A, the first structure 410 may have an undercut shape (or an inversed tapered shape) 412 at one surface facing the flexible display 151. In this case, the first structure 410 may be formed of at least one of thermoplastic polyurethane (TPU) or thermoplastic elastomer (TPE). The hardness of the first structure 410 may be, for example, about 40 to 60.

Referring to FIG. 9B, the first structure 410 may have a pattern of protrusions 414 on one surface facing the flexible display 151. The first structure 410 may be formed of a silicone material.

As described above, a structure for minimizing an area contacting the flexible display 151 may be applied to the first structure 410, thereby preventing a shape distortion due to a friction with the flexible display 151.

For example, the second structure 420 may be disposed between the second area 151R and the third frame to face the flexible display 151 in a tangential direction.

The second structure 420 may be a component for preventing the external material entering between the flexible display 151 (e.g., the third area 151C) and the third frame (e.g., the second frame 220) from moving to the second area 151R.

Meanwhile, the external material may be blocked not to move to the second area 151R and thus, discharged to outside through an outlet on one side of the third frame.

For example, the outlet may be covered by a frame cover 430. The frame cover 430 may be provided as a structure to be detachably coupled to the third frame.

Figure 10A:
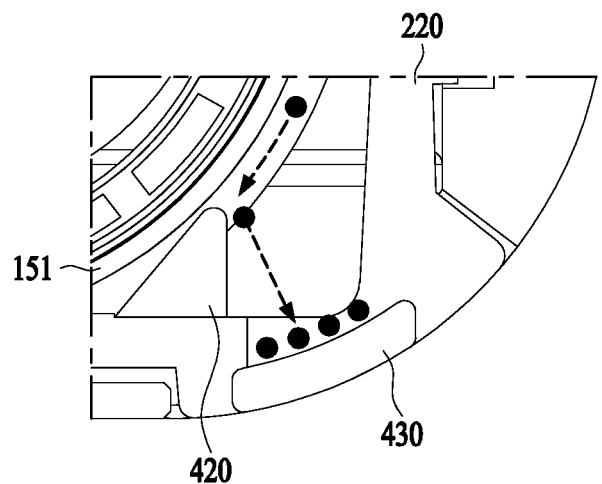
FIGS. 10A through 10O are views illustrating a structure for discharging a foreign substance according to example embodiments of the present disclosure.

FIGS. 10A through 10O are views illustrating a structure for discharging a foreign substance according to example embodiments of the present disclosure.

Referring to FIG. 10A, an external material (e.g., a foreign substance) entering between the flexible display 151 and the third frame may be blocked by the second structure 420 not to move to the second area 151R, and accumulated in a vicinity of an outlet near the second structure 420.

Figure 10B:
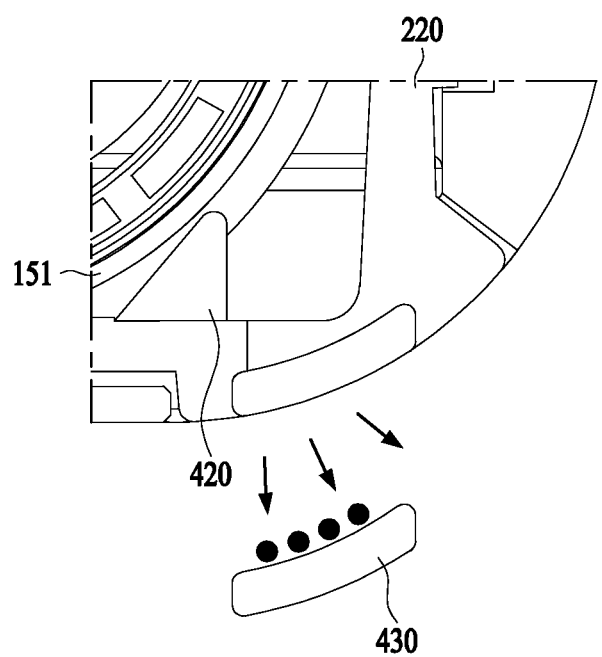
Figure 10C:
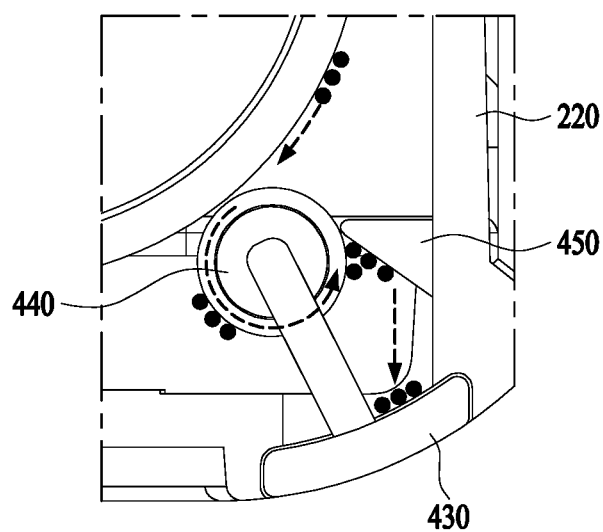

As illustrated in FIG. 10B, the accumulated external material (e.g., the foreign substance) may be discharged to outside when the frame cover 430 is detached from the third frame (e.g., the second frame 220).

In another example embodiment, the frame cover 430 may be formed of a mesh-type material instead of being provided as a structure detachably coupled to the third frame.

In another example embodiment, a second structure may include a third structure 440 provided in a shape of a roller to be rotatable in one direction as illustrated in FIG. 10O.

For example, the third structure 440 may be formed of a material that absorbs the external material (e.g., the foreign substance) entering between the third area 151C and the third frame. The third structure 440 may absorb the external material and move the external material toward the outlet of the third frame. When the frame cover 430 that is provided as a detachable structure and covers the outlet is detached from the third frame, the third structure 440 may discharge the external material to outside.

When the electronic apparatus 100 includes the third structure 440, a fourth structure 450 may be additionally provided between the flexible display 151 and the third frame (e.g., the second frame 220) to prevent the external material moved by the third structure 440 toward the outlet from moving to a space between the third area 151C and the third frame.

According to example embodiments, an electronic apparatus may selectively increase or reduce an image display area on a front surface or a rear surface using a flexible display. Therefore, it is possible to easily carry the electronic apparatus and selectively use a large size display.

Further, according to example embodiments, an electronic apparatus may minimize an inflow of an external material (e.g., a foreign substance) due to a change in shape of a flexible display and, even when the external material enters, easily discharge the external material. Through this, it is possible to prevent a damage (e.g., a scratch on a display, etc.) of the electronic apparatus due to the external material.

Although exemplary embodiments of the present disclosure have been described for illustrative purposes, those skilled in the art will appreciate that various modifications, additions, and substitutions are possible, without departing from the essential characteristics of the disclosure. Therefore, exemplary embodiments of the present disclosure have been described for the sake of brevity and clarity. Accordingly, those skilled in the art will understand the scope of the disclosure is not limited by the explicitly described above embodiments but by the claims and equivalents thereof.

What is claimed is:

1. An electronic apparatus comprising:
a flexible display comprising:
a first area configured to display an image on a front side of the electronic apparatus;
a second area configured to display an image on a rear side of the electronic apparatus; and
a third area positioned between the first area and the second area, a position of the third area being changeable;
a frame configured to cover the third area of the flexible display; and
at least one structure located between the flexible display and the frame and configured to block an inflow of an external material,
wherein the at least one structure comprises:
a first structure having one end fixed to the frame and another end extending toward the first area such that a foreign substance entering between the first area and the frame is blocked, and
wherein the first structure has an undercut shape at an inner side surface facing the flexible display.

2. The electronic apparatus of claim 1, wherein the at least one structure further comprises:
a second structure disposed between the second area and the frame, facing the flexible display in a tangential direction of the flexible display and configured to prevent an external material entering between the third area and the frame from moving to the second area.

3. The electronic apparatus of claim 2, further comprising:
an outlet through which the external material entering between the third area and the frame is discharged to outside; and
a frame cover disposed to cover the outlet and detachably attached to the frame.

4. The electronic apparatus of claim 3, wherein the second structure has a shape of a roller and is configured to:
absorb the external material entering between the third area and the frame; and
cause a foreign substance entering between the first area and the frame to move to the outlet.

5. The electronic apparatus of claim 4, wherein the second structure having the shape of the roller is configured to be rotatable in one direction.

6. The electronic apparatus of claim 1, wherein the first structure is formed of at least one of thermoplastic polyurethane (TPU), thermoplastic elastomer (TPE), or a silicone material.

7. The electronic apparatus of claim 1, wherein a hardness of the first structure is about 40 to 60.

8. The electronic apparatus of claim 1, further comprising:
an outlet through which the external material entering between the third area and the frame is discharged to outside; and
a frame cover formed of a mesh-type material.

9. The electronic apparatus of claim 1, further comprising:
a first frame configured to support at least a portion of the first area; and
a second frame configured to support the second area;
wherein the second frame is configured to slidably move relative to the first frame in response to a change in shape of the flexible display.

10. The electronic apparatus of claim 9, the second frame comprising the frame configured to cover the third area.

* * * * *